(12) United States Patent
Brunner et al.

(10) Patent No.: US 9,551,080 B2
(45) Date of Patent: Jan. 24, 2017

(54) COPPER PLATING BATH COMPOSITION

(71) Applicant: Atotech Deutschland GmbH, Berlin (DE)

(72) Inventors: Heiko Brunner, Berlin (DE); Bernd Roelfs, Berlin (DE); Agnieszka Witczak, Berlin (DE); Lars Kohlmann, Berlin (DE); Olivier Mann, Berlin (DE); Christian Ohde, Berlin (DE); Timo Bangerter, Berlin (DE); Angelo Ferro, Berlin (DE); Andreas Kirbs, Berlin (DE); Andre Schmökel, Berlin (DE); Dirk Rohde, Wethau (DE); Stefanie Ackermann, Berlin (DE)

(73) Assignee: Atotech Deutschland GmbH, Berlin (DE)

( * ) Notice: Subject to any disclaimer, the term of this patent is extended or adjusted under 35 U.S.C. 154(b) by 0 days.

(21) Appl. No.: 14/646,739

(22) PCT Filed: Nov. 12, 2013

(86) PCT No.: PCT/EP2013/073629
§ 371 (c)(1),
(2) Date: May 22, 2015

(87) PCT Pub. No.: WO2014/079737
PCT Pub. Date: May 30, 2014

(65) Prior Publication Data
US 2015/0299883 A1    Oct. 22, 2015

(30) Foreign Application Priority Data

Nov. 26, 2012 (EP) .................................. 12194261

(51) Int. Cl.
*C25D 3/38* (2006.01)
*C25D 5/02* (2006.01)
(Continued)

(52) U.S. Cl.
CPC . *C25D 3/38* (2013.01); *C25D 3/58* (2013.01); *C25D 5/02* (2013.01); *H01L 21/2885* (2013.01); *H01L 21/76898* (2013.01)

(58) Field of Classification Search
CPC ............... C25D 3/38; C25D 3/40; C25D 5/02; C25D 3/58; H01L 21/76898; H01L 21/2885
See application file for complete search history.

(56) References Cited

U.S. PATENT DOCUMENTS

| | | | |
|---|---|---|---|
| 4,419,192 A * | 12/1983 | Dahms | C25D 17/10 205/101 |
| 6,387,229 B1 * | 5/2002 | Cornelius Verberne | C25D 3/565 204/244 |

(Continued)

FOREIGN PATENT DOCUMENTS

| CN | 1410601 | 4/2003 |
|---|---|---|
| CN | 1507505 | 6/2004 |

(Continued)

OTHER PUBLICATIONS

PCT/EP2013/073629; PCT International Search Report and Written Opinion of the International Searching Authority dated Jul. 10, 2014.

(Continued)

*Primary Examiner* — Louis Rufo
(74) *Attorney, Agent, or Firm* — Renner, Otto, Boisselle & Sklar, LLP

(57) ABSTRACT

The present invention relates to aqueous acidic plating baths for copper and copper alloy deposition in the manufacture of (Continued)

printed circuit boards, IC substrates, semiconducting and glass devices for electronic applications. The plating bath according to the present invention comprises copper ions, at least one acid and an ureylene polymer comprising amino residues on both termini and which is free of organically bound halogen. The plating bath is particularly useful for filling recessed structures with copper and build-up of pillar bump structures.

16 Claims, 5 Drawing Sheets

(51) Int. Cl.
  *C25D 3/58* (2006.01)
  *H01L 21/768* (2006.01)
  *H01L 21/288* (2006.01)

(56) References Cited

U.S. PATENT DOCUMENTS

| | | | |
|---|---|---|---|
| 7,582,199 B2 * | 9/2009 | Knop | C25D 5/18 205/104 |
| 2004/0187731 A1 * | 9/2004 | Wang | C25D 3/38 106/1.13 |
| 2009/0205969 A1 | 8/2009 | Jimenez et al. | |
| 2012/0160698 A1 * | 6/2012 | Brunner | C08G 71/02 205/244 |
| 2013/0140185 A1 * | 6/2013 | Weyhmueller | C25D 3/58 205/240 |
| 2014/0138252 A1 | 5/2014 | Dambrowsky et al. | |

FOREIGN PATENT DOCUMENTS

| | | |
|---|---|---|
| CN | 1564881 | 1/2005 |
| CN | 1806067 | 7/2006 |
| CN | 102482417 | 5/2012 |
| EP | 2518187 | 10/2012 |
| WO | 2011029781 | 3/2011 |

OTHER PUBLICATIONS

PCT/EP2013/073629; PCT International Preliminary Report on Patentability mailed Feb. 11, 2015.

Official Action for corresponding Chinese Application No. 201380061184.6 dated Aug. 23, 2016.

* cited by examiner

COPPER PLATING BATH COMPOSITION

The present application is a U.S. National Stage Application based on and claiming benefit and priority under 35 U.S.C. §371 of International Application No. PCT/EP2013/073629, filed 12 Nov. 2013, which in turn claims benefit of and priority to European Application No. 12194261.9 filed 26 Nov. 2012, the entirety of both of which is hereby incorporated herein by reference.

FIELD OF THE INVENTION

The invention relates to additives and plating bath compositions for electro-deposition of copper or copper alloys. The plating bath compositions are suitable in the manufacture of printed circuit boards, IC substrates and the like as well as for metallization of semiconducting and glass substrates.

BACKGROUND OF THE INVENTION

Aqueous acidic plating baths for electrolytic deposition of copper are used for manufacturing printed circuit boards and IC substrates where fine structures like trenches, through holes (TH), blind micro vias (BMV) and pillar bumps need to be filled or build up with copper. Another application of such electrolytic deposition of copper is filling of recessed structures such as through silicon vias (TSV) and dual damascene plating or forming redistribution layers (RDL) and pillar bumps in and on semiconducting substrates. Still another application which is becoming more demanding is filling through glass vias, i.e. holes and related recessed structures in glass substrates with copper or copper alloys by electroplating.

The patent application EP 1 069 211 A2 discloses aqueous acidic copper plating baths comprising a source of copper ions, an acid, a carrier additive, a brightener additive and a leveler additive which can be poly[bis(2-chloroethyl)ether-alt-1,3-bis[3-(dimethylamino)propyl]urea (CAS-No. 68555-36-2) which contains an organo-bound halide atom (e.g., covalent C—Cl bonds) in at least one terminus (see comparative preparation example 1).

Such leveler additives in acidic copper plating baths are not suitable to fulfill the current and future requirements in manufacture of advanced printed circuit boards, IC substrates and metallization of semiconducting and glass substrates. Depending on the circuitry layout, BMVs' in printed circuit boards and IC substrates need to be filled with copper completely and not only conformally. Typical requirements for BMV filling are for example: obtaining a completely filled BMV while depositing no more than 10 to 15 µm of copper onto the neighbouring planar substrate areas and at the same time creating a dimple on the outer surface of the filled BMV of no more than 0 to 10 µm.

In metallization of semiconducting wafers, TSV filling must lead to a complete and void-free filling with copper while creating no more than ⅕ of via diameter of overplated copper onto the neighbouring planar areas. Similar requirements are demanded for filling through glass vias with copper.

OBJECTIVE OF THE INVENTION

Thus, it is an objective of the present invention to provide an aqueous acidic copper plating bath for electrolytic deposition of copper or copper alloys which fulfills the requirements for the above mentioned applications in the field of printed circuit board and IC substrate manufacturing as well as metallisation of semiconducting substrates like TSV filling, dual damascene plating, deposition of redistribution layers or pillar bumping and filling of through glass vias.

SUMMARY OF THE INVENTION

This objective is solved with an aqueous acidic plating bath composition comprising a source of copper ions, an acid and at least one ureylene polymer having terminal amino groups on both ends (termini) of the polymer chain wherein said aqueous acidic copper electroplating bath is free of intentionally added zinc ions.

Recessed structures such as trenches, blind micro vias (BMVs'), through silicon vias (TSVs') and through glass vias can be filled with copper deposited from the aqueous acidic copper plating bath according to the present invention. The copper filled recessed structures are void free and have an acceptable dimple, i.e., a planar or almost planar surface. Furthermore, the build-up of pillar bump structures is feasible.

BRIEF DESCRIPTION OF THE FIGURES

FIG. 1 shows the $^1$H-NMR spectrum of the ureylene polymer obtained in preparation example 1a.

DETAILED DESCRIPTION OF THE INVENTION

Figure 1:
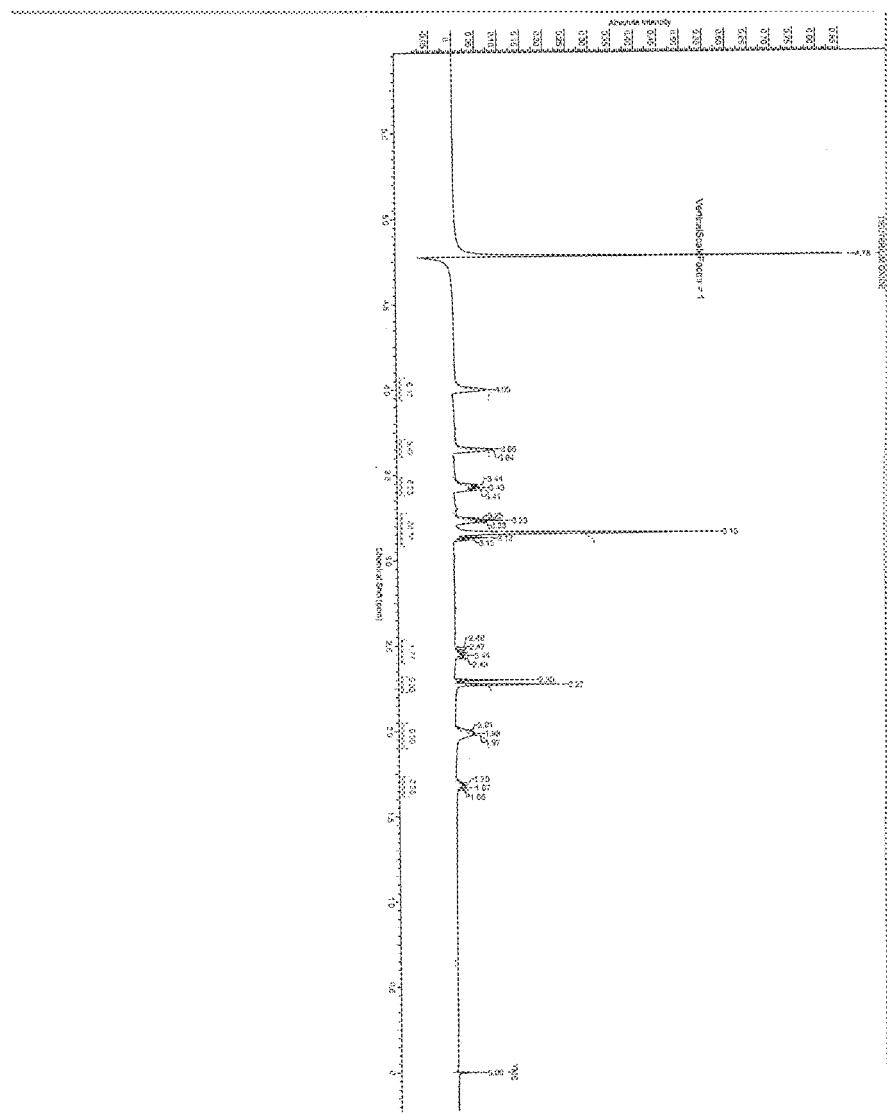

The aqueous acidic copper plating bath according to the present invention comprises at least one ureylene polymer of the following Formulae (I), (III) and (III)

(I)

(II)

(III)

wherein A independently represents a unit derived from a diamino compound of one of the following Formulae (IV) and (V)

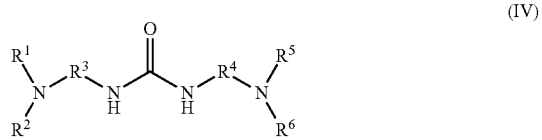

(IV)

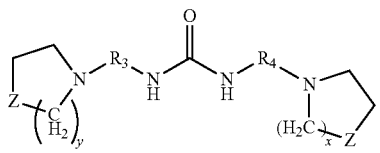
(V)

R1, R2, R5, and R6 are independently selected from the group consisting of hydrogen, a substituted or unsubstituted hydrocarbon residue with 1 to 10 carbon atoms, preferably methyl, ethyl, hydroxyethyl or —$CH_2CH_2(OCH_2CH_2)_a$—OH, wherein a is an integer from 0 to 4, and R3 and R4 are independently selected from the group consisting of $(CH_2)_p$, wherein p is an integer from 2 to 12, preferably for an ethylene or propylene group, or for a —$[CH_2CH_2O]_m$—$CH_2CH_2$— group, wherein m is an integer from 1 to 40, preferably for a —$(CH_2)_2$—O—$(CH_2)_2$— or —$(CH_2)_2$—O—$(CH_2)_2$—O—$(CH_2)_2$— group, Z may be the same or different and represents O or S, preferably, Z is the same, most preferably, Z is O, x and y may be the same or different and are preferably an integer selected from 1, 2 and 3, more preferably x and y are both 2;

wherein A' represents a unit derived from an amine of the Formula (VI)

(VI)

wherein R7 and R8 are independently selected from the group consisting of hydrogen, a substituted or unsubstituted hydrocarbon residue preferably with 1 to 16 carbon atoms, more preferably with 1 to 10 carbon atoms, linear or branched, hydroxyethyl or —$CH_2CH_2(OCH_2CH_2)_a$—OH, wherein a is an integer from 1 to 4, substituted or unsubstituted alkaryl, alkhetaryl, allyl or propargyl, and wherein L stands for a divalent residue, which is selected from the group consisting of —$(CH_2)_p$—, wherein p is an integer from 1 to 12, preferably from 1 to 6, and most preferably from 2 to 4,
—$CH_2$—CH(OH)—$CH_2$—,  —$[CH_2O]_q$—$CH_2CH_2$—,
—$[CH_2CH_2O]_q$—$CH_2CH_2$—, —$CH_2$—CH(SH)—$CH_2$—,
—$[CH_2S]_q$—$CH_2CH_2$—,  —$[CH_2CH_2S]_q$—$CH_2CH_2$—,
—$CH_2$—CH(OH)—$CH_2$—R9-$CH_2$—CH(OH)—$CH_2$—
and —$CH_2CH(OH)CH_2$— wherein q is an integer from 1 to 40, preferably —$CH_2$—O—$(CH_2)_2$—, —$(CH_2)_2$—O—$(CH_2)_2$— or —$(CH_2)_2$—O—$(CH_2)_2$—O—$(CH_2)_2$— and
wherein R9 is selected from the group consisting of a substituted or unsubstituted hydrocarbon residue preferably with 0 to 10 carbon atoms, more preferably from to 2 carbon atoms,  —O—$CH_2CH(OH)$—$CH_2O$— and —O—$[CH_2CH_2O]_q$—$CH_2O$—, wherein q is an integer preferably from 1 to 40, more preferably from 1 to 30 and most preferably from 1 to 12;

wherein the single units A may be the same or different,
wherein the single units A' may be the same or different,
wherein the single units L may be the same or different,
wherein n represents an integer and preferably ranges from 1 to 40, more preferably from 3 to 30 and most preferably from 5 to 20, and wherein the polymers according to Formula (I) have units A at both ends of the polymer chain, the polymers according to Formula (II) have units A' at both ends of the polymer chain and the polymers according to Formula (III) have a unit A at one end and a unit A' at the other end of the polymer chain.

R1, R2, R5 and R6 may represent, as mentioned before, a substituted or unsubstituted hydrocarbon residue having 1 to 10 carbon atoms, preferably methyl, ethyl, hydroxyethyl or —$CH_2CH_2(OCH_2CH_2)_y$—OH, wherein y is an integer from 1 to 4. The aforementioned hydrocarbon residues can, in particular, be substituted with $C_1$-$C_6$ alkyl (preferably —$CH_3$, —$CH_2CH_3$), aryl (preferably phenyl) or aralkyl (preferably benzyl).

The term "polymer" has to be understood in a broad sense in connection with the present invention. It comprises any compound which has been formed by reaction of at least two monomer unit A and one divalent residue L (polymers according to Formula (I)), any compound which has been formed by reaction of at least two monomer unit A, one monomer unit A' and two divalent residues residues L (polymers according to Formula (II)) and any compound which has been formed by reaction of at least one monomer unit A, two monomer unit A' and two divalent residues L (polymers according to Formula (III) with n=1). The term "polymer" does comprise, in particular, compounds which are typically designated as oligomers. The term "polymer" is, in connection with the present invention also applied to compounds, which are formed by a poly "condensation" reaction.

The ureylene polymer of Formulae (I), (II) and (III) can be obtained by reacting one or more diamino compounds of Formulae (IV) and/or (V) with one or more compounds of the following Formulae (VII),

P-L-Q  (VII)

wherein L has the same meaning as in Formulae (I), (II) and (III) and wherein P and Q may each be the same or different and represent halogens such as Cl, Br and I or pseudohalogens such as mesylate, triflate, nonaflate, methanesulfonate, or tosylate.

The ureylene polymers according to Formulae (I), (II) and (III) can also be obtained by reacting one or more diamine compounds according to Formulae (IV) and/or (V) with one or more compounds of the Formula (VIII) which form the divalent residue L. Accordingly, the divalent residue L in a polymer according to Formulae (I), (II) and (III) is a —$CH_2$—CH(OH)—$CH_2$—R9-$CH_2$—CH(OH)—$CH_2$— residue.

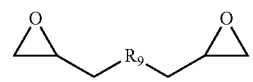
(VIII)

The compounds of the Formula (VIII) are diglycidyl or compounds or di-epoxides wherein R9 is selected from the group consisting of a substituted or unsubstituted hydrocarbon residue preferably with 0 to 10 carbon atoms, more preferably from 0 to 2 carbon atoms, —O—$CH_2CH(OH)$—$CH_2O$— and —O—$[CH_2CH_2O]_q$—$CH_2O$—, wherein q is an integer preferably from 1 to 40, more preferably from 1 to 30 and most preferably from 1 to 12.

The ureylene polymers according to Formulae (I), (II) and (III) can also be obtained by reacting one or more diamine compounds according to Formulae (IV) and/or (V) with one or more compounds of the Formula (IX) which form the divalent residue L. Accordingly, the divalent residue L in a polymer according to Formulae (I), (II) and (III) is a —CH$_2$CH(OH)CH$_2$— residue.

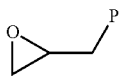
(IX)

The compounds of the Formula (IX) are epi(pseudo) halohydrines wherein P represents halogens such as Cl, Br and I or pseudohalogens such as OMs (mesylate), OTf (triflate), ONE (nonaflate), methanesulfonate, or OTs (tosylate).

In the case of the compounds of Formulae (VIII) and (IX) the linkages L between the units A occur via quaternary ammonium groups under formation of betainic structure moieties which are formed by opening the epoxide-structure by the tertiary amino groups from compounds according to Formulae (IV) and (V). The resulting polymers can be acidified by an appropriate mineral acid, such as hydrohalide acid, alkylsulfonic acid, arylsulfonic acid or sulfuric acid.

The molar ratio ($n_A$:$n_B$) of the total amount of substance used of the compound(s) of Formulae (IV) and/or (V) ($n_A$) to the total amount of substance of the compound(s) of Formulae (VII), (VIII) and (IX) ($n_B$) is preferably at least 1.1:1, more preferably 1.3:1, and most preferably at least 1.5:1.

Thereby, the ureylene polymers according to Formula (I) are obtained with units A having amino groups at both ends of the polymer chain and which do not comprise organically bound halogen such as a C—Cl moiety.

The ureylene polymers of Formula (II) can be obtained by reacting one or more diamino compounds of Formulae (IV) and/or (V) with one or more compounds of Formulae (VII), (VIII) and (IX) wherein the molar ratio ($n_A$:$n_B$) of the total amount of substance used of the compound(s) of Formulae (IV) and/or (V) ($n_A$) to the total amount of substance of the compound(s) of Formulae (VII), (VIII) and (IX) ($n_B$) is 1:1 The intermediate polymers obtained have the Formula (X)

(X)

The ureylene polymers according to Formula (III) are obtained by reacting one or more diamino compounds of Formulae (IV) and/or (V) with one or more compounds of Formulae (VII), (VIII) and (IX) wherein the molar ratio ($n_A$:$n_B$) of the total amount of substance used of the compound(s) of Formulae (IV) and/or (V) ($n_A$) to the total amount of substance of the compound(s) of Formulae (VII), (VIII) and (IX) ($n_B$) is at least 1:1.1, more preferably at least 1:1.3, and most preferably at least 1:1.5. The intermediate polymers obtained have the Formula (XI)

(XI)

Both intermediate ureylene polymers according to Formulae (X) and (XI) are further reacted with a compound according to Formula (VI) in order to obtain an ureylene polymer according to Formula (II) or (III). The ureylene polymers according to Formulae (II) or (III) then comprise units A' having amino groups at both ends (polymer according to Formula (III)) or a unit A' at one end and a unit A at the other end of the polymer chain (polymer according to Formula (II)) and no organically bound halogens such as a C—Cl moiety.

The linkages between units A (and A') and residues L occur via quaternary ammonium groups, which are formed linking the divalent residue L with the tertiary amino groups of the compounds of the Formulae (IV) and/or (V).

These terminal tertiary amino groups may be quaternized in accordance with the desired properties by using an organic (pseudo)monohalide, such as benzyl chloride, allyl chloride, alkyl chloride, such as 1-chloro-hexane or their corresponding bromides and mesylates, or by using an appropriate mineral acid, such as hydrochloric acid, hydrobromic acid, hydroiodic acid or sulfuric acid.

The ureylene polymers of the Formulae (I), (II) and (III) preferably have a weight average molecular mass $M_W$ of 1000 to 20000 Da, more preferably of 2000 to 15000 Da.

The reaction of diamino compounds of the Formulae (IV) and (V) with the compounds of the Formulae (VII), (VIII) and (IX) may preferably be carried out in aqueous or aqueous-alcoholic solutions or solvent-free substances at temperatures of preferably 20 to 100° C.

The ureylene polymers of the Formulae (I), (II) and (III) do not contain any organically bound halogen, such as a covalent C—Cl moiety.

In another embodiment of the present invention, halide ions serving as the counter ions of the positively charged ureylene polymers according to Formulae (I), (II) and (III) are replaced after preparation of the polymer by anions such as methane sulfonate, hydroxide, sulfate, hydrogensulfate, carbonate, hydrogencarbonate, alkylsulfonate such as methane sulfonate, alkarylsulfonate, arylsulfonate, alkylcarboxylate, alkarylcarboxylate, arylcarboxylate, phosphate, hydrogenphosphate, dihydrogenphosphate, and phosphonate. The halide ions can be for example replaced by ion exchange over a suitable ion exchange resin. The most suitable ion exchange resins are basic ion exchange resins such as Amberlyst® A21. Halide ions can then be replaced by adding an inorganic acid and/or an organic acid containing the desired anions to the ion exchange resin. The enrichment of halide ions in the aqueous acidic copper plating bath during use can be avoided if the polymers according to Formulae (I), (II) and (III) contain anions other than halide ions.

The concentration of the at least one ureylene polymer according to Formulae (I), (II) and (III) in the aqueous acidic copper plating bath preferably ranges from 0.001 mg/l to 200 mg/l, more preferably from 0.005 mg/l to 100 mg/l and most preferably from 0.01 mg/l to 50 mg/l.

The aqueous acidic copper plating bath composition preferably has a pH value of ≤2, more preferably of ≤1.

The aqueous acidic copper plating bath further contains at least one source of copper ions which is preferably selected from the group comprising copper sulfate and copper alkyl sulfonates such as copper methane sulfonate. The copper ion concentration in the aqueous acidic copper plating bath preferably ranges from 4 g/l to 90 g/l.

The aqueous acidic copper plating bath further contains at least one source of acid which is preferably selected from the group comprising sulfuric acid, fluoroboric acid, phosphoric acid and methane sulfonic acid and is preferably added in a concentration of 10 g/l to 400 g/l, more preferably from 20 g/l to 300 g/l.

The aqueous acidic copper plating bath preferably further contains at least one accelerator-brightener additive which is selected from the group consisting of organic thiol-, sulfide-, disulfide- and polysulfide-compounds. Preferred accelerator-brightener additives are selected from the group comprising 3-(benzthiazolyl-2-thio)-propylsulfonic-acid, 3-mercaptopropan-1-sulfonic-acid, ethylendithiodipropylsulfonic-acid, bis-(p-sulfophenyl)-disulfide, bis-(ω-sulfobutyl)-disulfide, bis-(ω-sulfohydroxypropyl)-disulfide, bis-(ω-sulfopropyl)-disulfide, bis-(ω-sulfopropyl)-sulfide, methyl-(ω-sulfopropyl)-disulfide, methyl-(ω-sulfopropyl)-trisulfide, O-ethyl-dithiocarbonic-acid-S-(ω-sulfopropyl)-ester, thioglycol-acid, thiophosphoric-acid-O-ethyl-bis-(ω-sulfopropyl)-ester, thiophosphoric-acid-tris-(ω-sulfopropyl)-ester and their corresponding salts. The concentration of all accelerator-brightener additives optionally present in the aqueous acidic copper bath compositions preferably ranges from 0.01 mg/l to 100 mg/l, more preferably from 0.05 mg/l to 10 mg/l.

The aqueous acidic copper plating bath optionally further contains at least one carrier-suppressor additive which is preferably selected from the group comprising polyvinylalcohol, carboxymethylcellulose, polyethyleneglycol, polypropyleneglycol, stearic acid polyglycolester, alkoxylated naphthols, oleic acid polyglycolester, stearylalcoholpolyglycolether, nonylphenolpolyglycolether, octanolpolyalkylenglycolether, octanediol-bis-(polyalkylenglycolether), poly(ethylenglycol-ran-propyleneglycol), poly(ethylenglycol)-block-poly(propylenglycol)-block-poly(ethylenglycol), and poly(propylenglycol)-block-poly(ethylenglycol)-block-poly(propylenglycol). More preferably, the optional carrier-suppressor additive is selected from the group comprising polyethylenglycol, polypropylenglycol, poly(ethylenglycol-ran-propylenglycol), poly(ethylenglycol)-block-poly(propylenglycol)-block-poly(ethylenglycol), and poly(propylenglycol)-block-poly(ethylenglycol)-block-poly(propylenglycol). The concentration of said optional carrier-suppressor additive preferably ranges from 0.005 g/l to 20 g/l, more preferably from 0.01 g/l to 5 g/l.

Optionally, the aqueous acidic copper plating bath contains in addition to the ureylene polymer according to Formulae (I), (II) or (III) at least one further leveler additive selected from the group comprising nitrogen containing organic compounds such as polyethyleneimine, alkoxylated polyethyleneimine, alkoxylated lactams and polymers thereof, diethylenetriamine and hexamethylenetetramine, organic dyes such as Janus Green B, Bismarck Brown Y and Acid Violet 7, sulphur containing amino acids such as cysteine, phenazinium salts and derivatives thereof. The preferred further leveler additive is selected from nitrogen containing organic compounds. Said optional leveler additive is added to the aqueous acidic copper plating bath in amounts of 0.1 mg/l to 100 mg/l.

The aqueous acidic copper plating bath optionally further contains at least one source of halogenide ions, preferably chloride ions in a quantity of 20 mg/l to 200 mg/l, more preferably from 30 mg/l to 60 mg/l. Suitable sources for halogenide ions are for example alkali halogenides such as sodium chloride.

The optional halogenide ions may be provided solely or partly by the ureylene polymer according to Formulae (I), (II) or (III) when the counter ions are halogenide ions.

The aqueous acidic copper plating bath is preferably operated in the method according to the present invention in a temperature range of 15° C. to 50° C., more preferably in a temperature range of 25° C. to 40° C. by applying an electrical current to the substrate and at least one anode. Preferably, a cathodic current density range of 0.0005 A/dm² to 12 A/dm², more preferably 0.001 A/dm² to 7 A/dm² is applied.

The plating bath according to the present invention can be used for DC plating and reverse pulse plating. Both inert and soluble anodes can be utilised when depositing copper from the plating bath according to the present invention.

In one embodiment of the present invention, a redox couple, such as $Fe^{2+/3+}$ ions is added to the plating bath. Such a redox couple is particularly useful, if reverse pulse plating is used combination with inert anodes for copper deposition. Suitable processes for copper plating using a redox couple in combination with reverse pulse plating and inert anodes are for example disclosed in U.S. Pat. No. 5,976,341 and U.S. Pat. No. 6,099,711.

The aqueous acidic copper plating bath can be either used in conventional vertical or horizontal plating equipment.

The aqueous acidic copper plating bath according to the present invention is essentially free of zinc ions. "Essentially free" is defined herein as "not intentionally added". Hence, the aqueous acidic copper plating bath according to the present invention does not contain intentionally added zinc ions.

The metal layer obtained by electroplating from said aqueous acidic copper plating bath is a copper or copper alloy layer. Accordingly, zinc and zinc alloy layers are not obtainable from said aqueous acidic copper plating bath because the bath does not contain intentionally added zinc ions.

The invention will now be illustrated by reference to the following non-limiting examples.

EXAMPLES

¹H-NMR spectra of the ureylene polymer obtained in preparation example 1a and comparative preparation example 1 were recorded at 500 MHz with a spectrum offset of 4300 Hz, a sweep width of 9542 Hz at 25° C. (Varian, NMR System 500). The solvent used was $D_2O$.

The weight average molecular mass $M_W$ of the ureylene polymers was determined by gel permeation chromatography (GPC) using a GPC apparatus from WGE-Dr. Bures equipped with a molecular weight analyzer BI-MwA from Brookhaven, a TSK Oligo+3000 column, and Pullulan and PEG standards with $M_W$=400 to 22000 g/mol. The solvent used was Millipore water with 0.5 acetic acid and 0.1 M $Na_2SO_4$.

Preparation of Ureylene Polymers According to Formula (I)

Preparation Example 1a

A polymer according to Formula (I) with a monomer A of Formula (IV) with $R^1$ and R2=methyl, R3 and R4=propyl and a monomer L with L=$(CH_2)_2O(CH_2)_2$ was prepared according to preparation example 12 in WO 2011/029781 A1.

The weight average molecular mass $M_W$ of the ureylene polymer obtained was 5380 Da.

The ¹H-NMR spectrum of said polymer is shown in FIG. 1. The ¹H-NMR spectrum shows a signal at 2.27 ppm which is characteristic of terminal N,N-dimethylamino groups. Further signals are observed at 1.67 ppm and 2.44 ppm which are characteristic for methyl residues bond to the terminal nitrogen atoms of the ureylene polymer.

Preparation Example 1b

The terminal amino residues of the ureylene polymer according to Formula (I) obtained by a similar procedure as preparation example 1 were quaternised with 1-chlorohexane (80° C. for 29 h while stirring and then held at 90° C. for 60 h). The resulting ureylene polymer had a weight average molecular mass $M_W$ of 7303 Da.

Preparation Example 2

A polymer with a monomer A of Formula (IV) with R1 and R2=methyl, R3 and R4=propyl and a monomer L with L=(CH$_2$)$_2$O(CH$_2$)$_2$O(CH$_2$)$_2$ was prepared according to preparation example 13 in WO 2011/029781 A1.
The ureylene polymer obtained had a weight average molecular mass $M_W$ of 6306 Da.

Preparation Example 3

50 g (217.1 mmol) 1,3-bis(3-(dimethylamino)propyl-urea and 26.88 g (186.1 mmol) 1-chloro-2-(2-chloroethoxy)-ethane were together dissolved in 76.34 g water. The solution was then held at 90° C. for 12 h. 153.22 g of an aqueous polymer solution containing 50 wt.-% of the ureylene polymer ($M_W$=11280 Da) were obtained.

Preparation Example 4

26.6 g (115 mmol) 1,3-bis-(3-(dimethylamino)-propyl)-urea were dissolved in 52.5 g water. 22.87 g (99 mmol) 1-chloro-2-(2-(2-chloroethoxy)-ethoxy)-ethane were added to this solution within 2 min at 80° C. while stirring. The resulting solution was further stirred at 80° C. for 24 h. 101.97 g of an aqueous polymer solution containing 48.51 wt.-% of the ureylene polymer (A=monomer according to Formula (IV) with $R^1$ and $R^2$=methyl, $R^3$ and $R^4$=propyl; L=(CH$_2$)$_2$O(CH$_2$)$_2$O(CH$_2$)$_2$; $M_W$=13430 Da) were obtained.

Preparation Example 5

23.6 g (74.9 mmol) N,N'-bis(morpholinopropyl)-urea (monomer A according to Formula (V)) were dissolved in 58.3 g water and heated to 80° C. 15.3 g (64.2 mmol) 1-chloro-2-(2-(2-chloroethoxy)-ethoxy)-ethane were added to this solution within 1 min while stirring. The solution was then held at 80° C. for 10 h while stirring and then 24 h at 95° C. and finally refluxed for 48 h. 97.125 g of an aqueous polymer solution containing 40 wt.-% of the ureylene polymer (A=monomer according to Formula (V) with $R^3$ and $R^4$=propyl and Z=O; L=(CH$_2$)$_2$O(CH$_2$)$_2$O(CH$_2$)$_2$; $M_W$=2689 Da).

Preparation Example 6

A polymer according to Formula (I) with a monomer A of Formula (IV) with $R^1$ and $R^2$=methyl, $R^3$ and $R^4$=propyl and a monomer L with L=(CH$_2$)$_3$ was prepared according to preparation example 10 in WO 2011/029781 A1. The weight average molecular mass $M_W$ of the ureylene polymer was 5380 Da.

Preparation Example 7

The ureylene polymer obtained in preparation example 1a was ion exchanged with a basic ion exchanger III/OH$^-$ form (Amberlyst A21) and then mixed with methane sulfonic acid.
The ureylene polymer obtained comprised then methane sulfonate anions instead of chloride ions.

Preparation Example 8

25 g 1,3-bis-(3-(dimethylamino)-propyl)-urea were dissolved in 50 g water. 21.36 g oxybis-(ethane-2,1-diyl)-dimethanesulfonate were added to this solution. The resulting solution was further stirred at 80° C. for 5.5 h. 92.72 g of an aqueous polymer solution containing 50 wt.-% of the ureylene polymer (A=monomer according to Formula (IV) with $R^1$ and $R^2$=methyl, $R^3$ and $R^4$=propyl; L=(CH$_2$)$_2$O (CH$_2$)$_2$O(CH$_2$)$_2$; $M_W$=9461 Da) were obtained.

Preparation Example 9

25 g oxybis-(ethane-2,1-diyl)dimethansulfonate were dissolved in 39.10 g water. 14.10 g 1,3-bis[3-(dimethylamino) propyl]urea were added to this solution. The resulting solution was further stirred at 80° C. for 17 hours. Afterwards, 2.99 g butylamine were added and the resulting reaction mixture was stirred for additional 20 hours at 80° C. 81.2 g of an aqueous polymer solution containing 50 wt-% of the ureylene polymer according to Formula (II) were obtained (A=monomer according to Formula (IV) with R1 and R2=methyl; R3 and R4=propyl; L=(CH$_2$)$_2$O(CH$_2$)$_2$O(CH$_2$)$_2$ and A' monomer according to Formula (VI) with R7=butyl and R8=hydrogen; $M_W$=4600 Da.

Comparative Preparation Example 1

Figure 2:
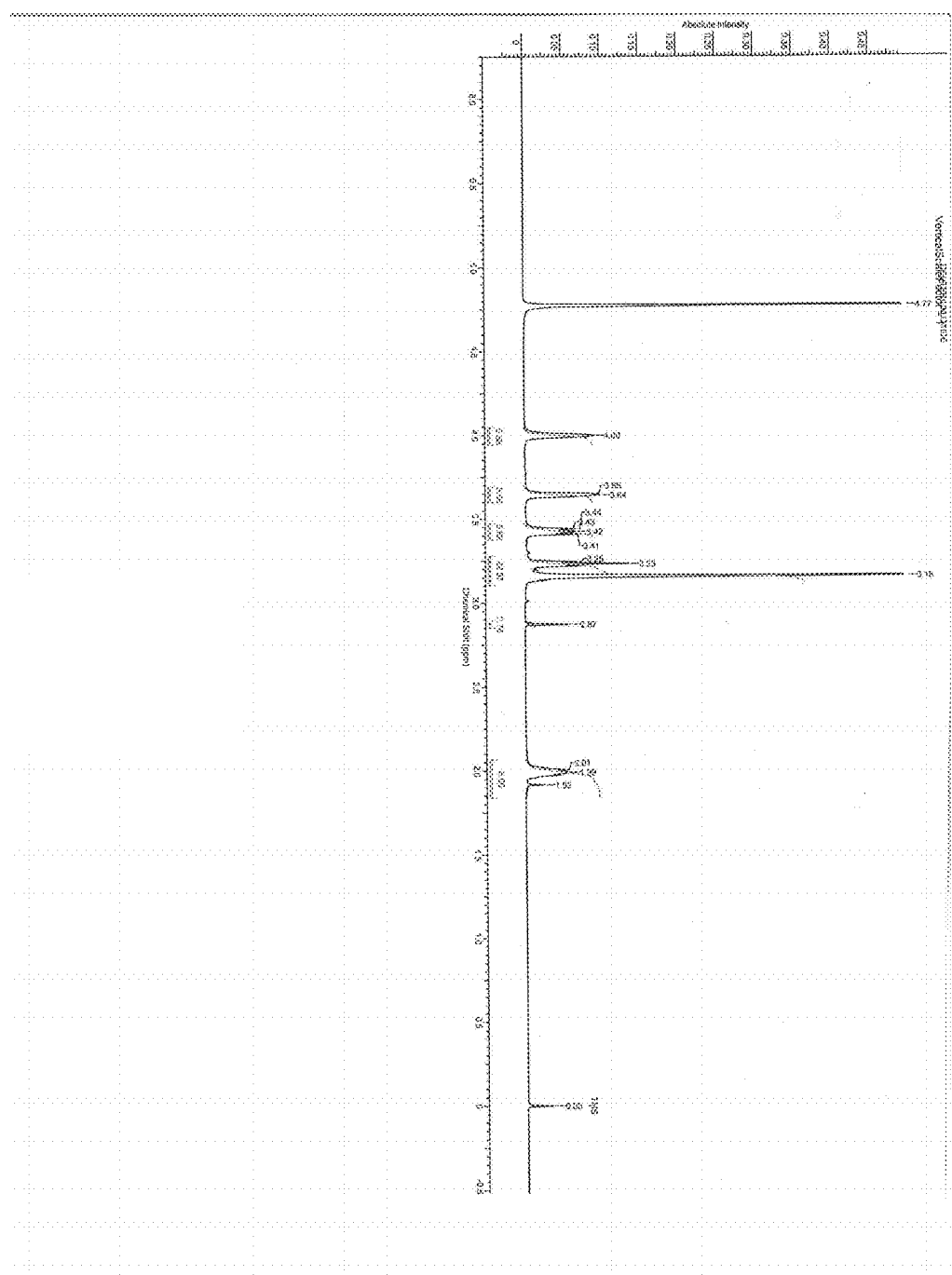
FIG. 2 shows the $^1$H-NMR spectrum of the ureylene polymer poly[bis(2-chloroethyl)-ether-alt-1,3-bis[3-(dimethylamino)propyl]urea (comparative preparation example 1).

Poly[bis(2-chloroethyl)ether-alt-1,3-bis[3-(dimethylamino)propyl]urea (CAS-No. 68555-36-2), a leveler additive disclosed in EP 1 069 211 A2 was purchased from Sigma-Aldrich.
The $^1$H-NMR spectrum of said ureylene polymer (shown in FIG. 2) contains no signal at 2.27 ppm and thus contains no such terminal N,N-dimethylamino groups (FIG. 1). Hence, poly[bis(2-chloroethyl)ether-alt-1,3-bis[3-(dimethylamino)-propyl]urea contains no (detectable amount of) terminal amino groups and does not have amino groups at both ends of the polymer chain. Moreover, the signals at 1.67 ppm and 2.44 ppm observed in the 1H-NMR spectrum of the ureylene polymer according to Formula (I) obtained in preparation sample 1a (FIG. 1) and the signal at 2.87 ppm observed in the 1H-NMR spectrum of poly[bis(2-chloroethyl)ether-alt-1,3-bis[3-(dimethylamino)propyl]urea (FIG. 2) show that both ureylene polymers are structurally different.

Figure 3:
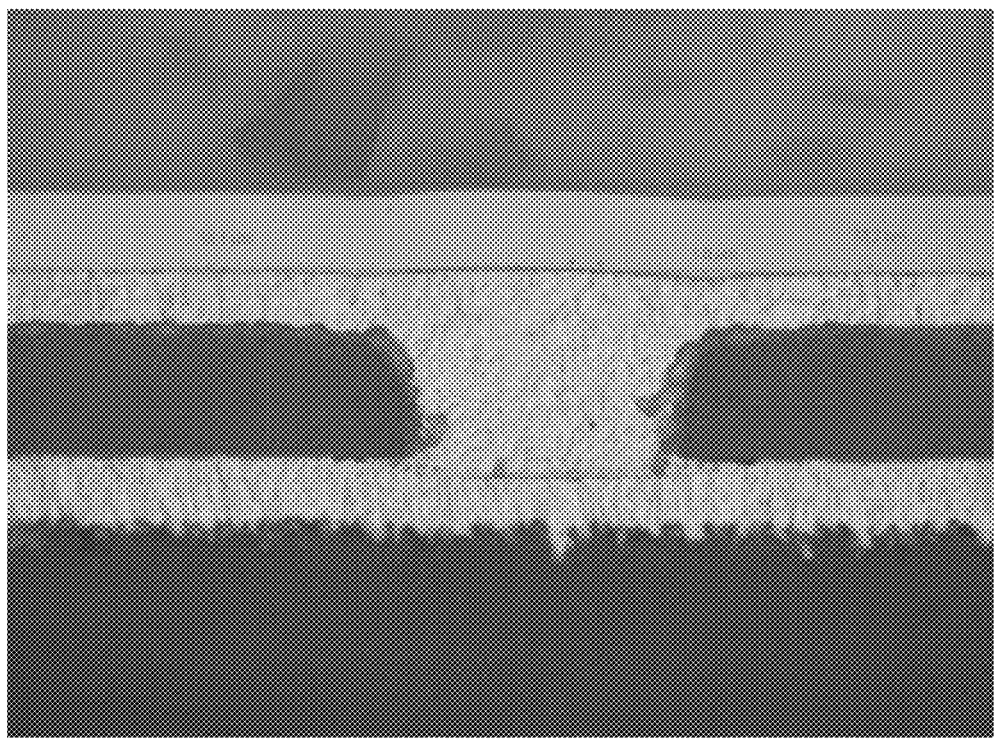
FIG. 3 shows a copper filled blind micro via obtained in application example 1.

Copper Deposition into BMVs':
The electrolyte baths containing the ureylene polymers prepared according to preparation examples 1a to 6 were used as additives for deposition of copper into recessed structures and then subjected to the following test method.
A sufficient BMV filling with copper means that the copper deposit has no or almost no so-called dimple (depression of the copper surface at the point of the BMV). Hence, the copper surface of a sufficiently filled BMV is as even as possible.
An insufficient BMV filling is characterised by a concave structure of the copper deposit, i.e. by a dimple. Voids in a copper filled via are also not desired.
The cross sections of recessed structures filled with copper were investigated with an optical microscope after depositing a protection layer of nickel onto the copper deposit and applying conventional grinding and polishing methods. A copper filled BMV obtained in application example 1 is shown in FIG. 3.
The values for "dimple" were recorded with a chromatic sensor (Nanofocus μ-scan with sensor CRT5).

Methods for Application Examples 1 to 16

Equipment: Gornall cell with 1.8 l volume, bath agitation with a pump, no air injection, soluble copper anodes.

A copper plating bath stock solution comprising 45 g/l $Cu^{2+}$ ions (added as copper sulfate), 50 g/l sulfuric acid, 45 mg/l $Cl^-$ ions, 300 mg/l polyethyleneglycol as a carrier-suppressor additive and 1.0 ml/l of a solution containing an organic brightener additive was used. The ureylene polymers according to Formula (I) were added to said stock solution (application examples 1 to 16).

A current density of 1.2 $A/dm^2$ was applied throughout application examples 1 to 16. The thickness of copper plated onto the top surface of the substrate was in average 12 μm. The plating time was 67 min. The test panels were cleaned, microetched and rinsed prior to electroplating of copper.

The test panels used throughout application examples 1 to 16 comprised BMVs' (depth×diameter: 80×30 μm and 100× 30 μm). The size of the test panels was 12×15 mm.

TABLE 1

Application examples 1 to 16 (BMV filling capability).

| Application example | Leveler additive | Leveler conc. (mg/l) | Dimple [μm] in 80 × 30 μm BMVs' | Dimple [μm] in 100 × 30 μm BMVs' |
|---|---|---|---|---|
| 1 | Preparation example 1a | 3 | 0 | 3.5 |
| 2 | (Preparation example 1a) | 10 | 0 | 4.5 |
| 3 | (Preparation example 1a) | 20 | 0 | 9 |
| 4 | Preparation example 1b | 5 | 0 | 3 |
| 5 | (Preparation example 1b) | 30 | 0 | 6 |
| 6 | Preparation example 2 | 3 | 0 | 2 |
| 7 | (Preparation example 2) | 10 | 0 | 3 |
| 8 | (Preparation example 2) | 30 | 0 | 3 |
| 9 | Preparation example 3 | 3 | 0 | 5.5 |
| 10 | (Preparation example 3) | 10 | 0 | 3.5 |
| 11 | (Preparation example 3) | 20 | 0 | 5 |
| 12 | Preparation example 4 | 5 | 0 | 4 |
| 13 | (Preparation example 4) | 30 | 4 | 8.5 |
| 14 | Preparation example 5 | 3 | 0 | 3.5 |
| 15 | (Preparation example 5) | 30 | 0 | 5.5 |
| 16 | Preparation example 6 | 3 | 2.5 | — |
| 17 | Preparation example 7 | 20 | 7 | 2.4 |
| 18 | Preparation example 8 | 10 | 0 | 3 |
| 19 | (Preparation example 8) | 30 | 0 | 4 |
| 20 | (Preparation example 8) | 50 | 0 | 2 |
| 21 | Preparation example 9 | 5 | 0.3 | 4.8 |
| 22 | (Preparation example 9) | 10 | 0 | 3.8 |

The values observed for dimples in both 80×30 μm and 100×30 μm BMVs' are sufficiently low. Hence, all the tested leveler additives are suitable for filling of BMVs' with copper.

Copper Deposition into TSVs'

Through-silicon vias (TSVs') in silicon wafer substrates having a width of 6 μm and a depth of 27 μm were filled with copper using an aqueous acidic copper electrolyte comprising 55 g/l copper ions, 50 g/l sulfuric acid, 50 mg/l chloride ions, 3 ml/l of a solution containing an organic brightener additive. Soluble anodes and a Nafion® membrane separating anolyte and catholyte were used. A current density of 3 $mA/cm^2$ was applied to the silicon wafer substrates for 25 min in order to fill the TSVs' with copper.

A given amount of a leveler additive was added to said electrolyte in comparative application example 1 and application example 23.

Comparative Application Example 1

30 mg/l of poly[bis(2-chloroethyl)ether-alt-1,3-bis[3-(dimethylamino)propyl]urea (disclosed in EP 1 069 211 A2) were added to the electrolyte prior to copper deposition.

Figure 4:
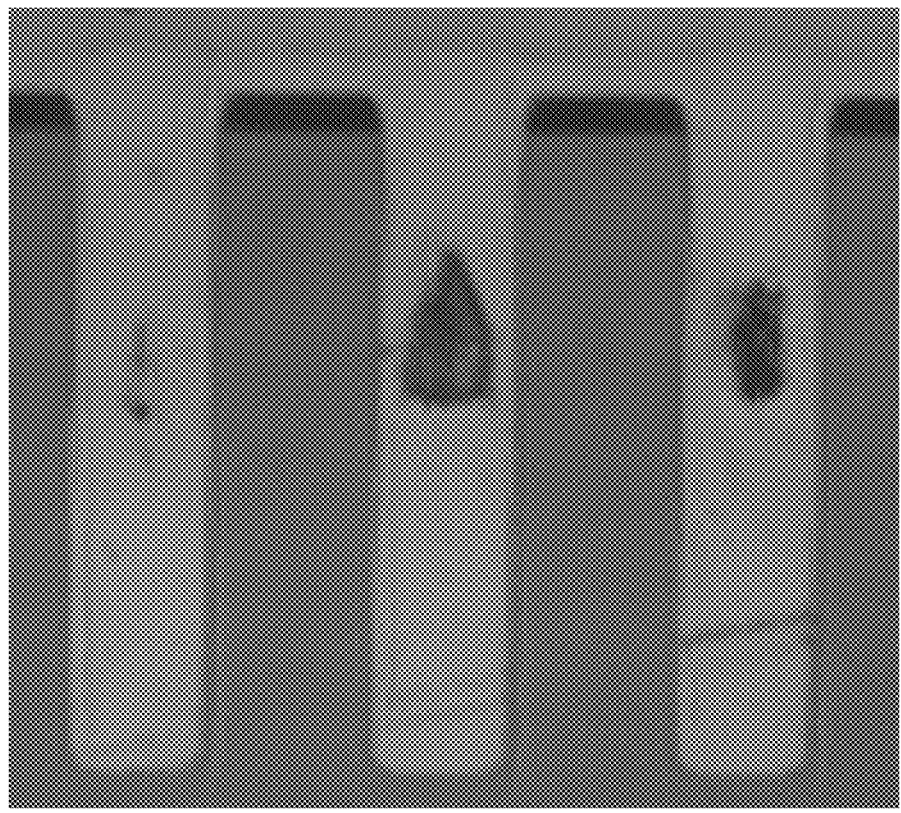
FIG. 4 shows copper filled through-silicon vias obtained in comparative application example 1.

The copper filled TSVs' obtained from this electrolyte show undesired voids in the copper deposit (FIG. 4).

Application Example 23

30 mg/l of the ureylene polymer according to Formula (I) obtained in preparation example 4 were added to the electrolyte prior to copper deposition.

Figure 5:
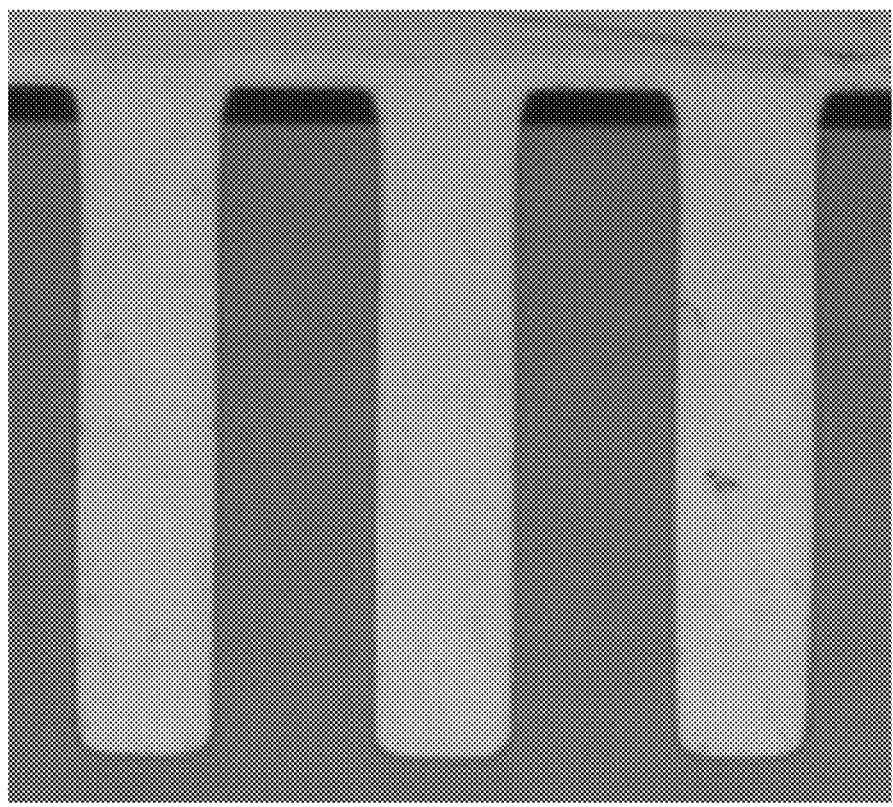
FIG. 5 shows copper filled through-silicon vias obtained in application example 23.

A void free filling of TSVs' was achieved (FIG. 5). The surface of the copper deposit was semi-bright and defect free.

The invention claimed is:

1. An aqueous acidic copper electroplating bath comprising a source of copper ions, an acid and at least one ureylene polymer selected from polymers according to Formulae (I), (II) and (III)

(I)

(II)

(III)

wherein A represents a unit derived from a diamino compound of the following Formulae (IV) and/or (V)

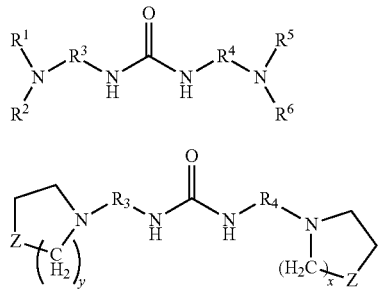

R$^1$, R$^2$, R$^5$, and R$^6$ are independently selected from the group consisting of substituted or unsubstituted hydrocarbon residues with 1 to 10 carbon atoms, and —CH$_2$CH$_2$(OCH$_2$CH$_2$)$_a$—OH, wherein a is an integer from 0 to 4,
R$^3$ and R$^4$ are independently selected from the group consisting of (CH$_2$)$_p$, wherein p is an integer from 2 to 12, and a —[CH$_2$CH$_2$O]$_m$—CH$_2$CH$_2$— group, wherein m is an integer from 1 to 40,
Z may be the same or different and represents O or S,
x and y may be the same or different and are an integer selected from 1, 2 and 3
wherein A' represents a unit derived from a diamino compound of the following Formulae (VI)

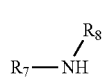

wherein R$^7$ and R$^8$ are independently selected from the group consisting of hydrogen, a substituted or unsubstituted hydrocarbon residue with 1 to 16 carbon atoms, linear or branched alkyl, hydroxyethyl or —CH$_2$CH$_2$(OCH$_2$CH$_2$)$_a$—OH, wherein a is an integer from 1 to 4, substituted or unsubstituted alkaryl, alkhetaryl, allyl or propargyl and
wherein L is a divalent residue, which is selected from the group consisting of —(CH$_2$)$_s$—, wherein s is an integer from 1 to 12,
—CH$_2$—CH(OH)—CH$_2$—, —[CH$_2$O]$_q$—CH$_2$CH$_2$—, —[CH$_2$CH$_2$O]$_q$—CH$_2$CH$_2$—,
—CH$_2$—CH(SH)—CH$_2$—, and —[CH$_2$S]$_q$—CH$_2$CH$_2$—, —[CH$_2$CH$_2$S]$_q$—CH$_2$CH$_2$— wherein q is an integer from 1 to 40,
—CH$_2$—CH(OH)—CH$_2$—R9-CH$_2$—CH(OH)—CH$_2$—
wherein R$^9$ is selected from the group consisting of a substituted or unsubstituted hydrocarbon residue, —O— CH$_2$CH(OH)—CH$_2$O— and —O—[CH$_2$CH$_2$O]$_q$—CH$_2$O—, wherein q is an integer from 1 to 40, and —CH$_2$CH(OH)CH$_2$—;
wherein the single units A may be the same or different,
wherein the single units A' may be the same or different
wherein the single units L may be the same or different,
wherein n represents an integer from 1 to 40, and
wherein the ureylene polymers according to Formulae (I), (II) and (III) have an amino residue at both ends and wherein said aqueous acidic copper electroplating bath is essentially free of zinc ions, wherein the concentration of the ureylene polymer according to Formulae (I), (II) and (III) ranges from 0.001 mg/l to 200 mg/l and wherein the aqueous acidic copper electroplating bath has a pH value of ≤1.

2. The aqueous acidic copper electroplating bath according to claim 1 wherein R$^1$, R$^2$, R$^5$ and R$^6$ are independently selected from the group consisting of methyl, ethyl, hydroxyethyl, and —CH$_2$CH$_2$(OCH$_2$CH$_2$)$_a$—OH, and wherein a is an integer from 1 to 4.

3. The aqueous acidic copper electroplating bath according to claim 1 wherein R$^3$ and R$^4$ are independently selected from the group consisting of ethylene, propylene, —(CH$_2$)$_2$—O—(CH$_2$)$_2$—, and —(CH$_2$)$_2$—O—(CH$_2$)$_2$—O—(CH$_2$)$_2$—.

4. The aqueous acidic copper electroplating bath according to claim 1 wherein the ureylene polymers according to Formulae (I), (II) and (III) do not have organically bound halogen.

5. The aqueous acidic copper electroplating bath according to claim 1 wherein the terminal amino groups in the ureylene polymer according to Formulae (I), (II) and (III) are quaternised with a residue selected from H, alkyl, allyl and benzyl.

6. The aqueous acidic copper electroplating bath according to claim 1 wherein the ureylene polymer of Formulae (I), (II) and (III) has a weight average molecular mass Mw in the range of 1000 to 20000 Da.

7. The aqueous acidic copper electroplating bath according to claim 1 wherein the concentration of copper ions ranges from 4 to 90 g/l.

8. The aqueous acidic copper electroplating bath according to claim 1 wherein the acid is selected from sulfuric acid, fluoro boric acid, phosphoric acid and methane sulfonic acid.

9. The aqueous acidic copper electroplating bath according to claim 1 wherein the aqueous acidic copper electroplating bath further comprises halide ions.

10. The aqueous acidic copper electroplating bath according to claim 9 wherein concentration of halide ions ranges from 20 mg/l to 200 mg/l.

11. The aqueous acidic copper electroplating bath according to claim 1 wherein the aqueous acidic copper electroplating bath further comprises an accelerator-brightener additive selected from organic thiol-, sulfide-, disulfide- and polysulfide-compounds.

12. A method for deposition of copper onto a substrate comprising, in this order, the steps
a. providing a substrate and
b. contacting the substrate with an aqueous acidic copper electroplating bath according to claim 1,
c. applying an electrical current between the substrate and at least one anode,
and thereby depositing copper onto the substrate.

13. The method for deposition of copper onto a substrate according to claim 12 wherein the substrate is selected from printed circuit boards, IC substrates, semiconducting wafers and glass substrates.

14. The method for deposition of copper onto a substrate according to claim 12 wherein copper is deposited into recessed structures selected from trenches, blind micro vias, through silicon vias and through glass vias.

15. The aqueous acidic copper electroplating bath according to claim 2 wherein R$^3$ and R$^4$ are independently selected from the group consisting of ethylene, propylene, —(CH$_2$)$_2$—O—(CH$_2$)$_2$—, and —(CH$_2$)$_2$—O—(CH$_2$)$_2$—O—(CH$_2$)$_2$—.

16. The method for deposition of copper onto a substrate according to claim 13 wherein copper is deposited into recessed structures selected from trenches, blind micro vias, through silicon vias and through glass vias.

* * * * *